United States Patent [19]

Amano et al.

[11] Patent Number: 4,951,269

[45] Date of Patent: Aug. 21, 1990

[54] ECHO CANCELLER WITH SHORT PROCESSING DELAY AND DECREASED MULTIPLICATION NUMBER

[75] Inventors: Fumio Amano, Tokyo; Mohammad R. Asharif, Kawasaki; Shigeyuki Unagami, Atsugi; Yoshihiro Sakai, Kawasaki, all of Japan

[73] Assignee: Fujitsu Limited, Kawasaki, Japan

[21] Appl. No.: 216,907

[22] PCT Filed: Oct. 29, 1987

[86] PCT No.: PCT/JP87/00833

§ 371 Date: Jun. 24, 1988

§ 102(e) Date: Jun. 24, 1988

[87] PCT Pub. No.: WO88/03341

PCT Pub. Date: May 5, 1988

[30] Foreign Application Priority Data

Oct. 30, 1986 [JP] Japan ............................ 61-256750
Nov. 10, 1986 [JP] Japan ............................ 61-265470

[51] Int. Cl.[5] .............................................. G01S 15/00
[52] U.S. Cl. ................................. 367/135; 367/901; 367/903; 379/406
[58] Field of Search ............... 367/87, 135, 900, 901, 367/903; 364/726, 724.14, 724.18, 827, 724.19; 379/406, 411

[56] References Cited

U.S. PATENT DOCUMENTS 4,355,368 10/1982 Zeidler et al. .................. 364/724.03
4,593,161 6/1986 Desblache et al. ............. 379/411 X
4,807,173 2/1989 Sommen et al. ............... 364/724.18

OTHER PUBLICATIONS

"A Unified Approach to Time- and Frequency-Domain ... "; Gregory Clark et al., IEEE Transactions on Acoustics, Speech & Signal Processing, vol. 31, No. 5; Oct. 1983.
"Unconstrained Frequency-Adaptive Filter"; D. Mansour et al.; 726-734, IEEE Transactions on Acoustics, Speech & Signal Processing; vol. 30, No. 5; Oct. 1982.
"The Discrete Fourier Transform Applied to Time Domain Signal Processing"; pp. 13-22, F. J. Harris; IEEE Communications, May 1982.

Primary Examiner—Thomas H. Tarcza
Assistant Examiner—Tod Swann
Attorney, Agent, or Firm—Staas & Halsey

[57] ABSTRACT

An echo canceller in a system, having a long impulse response such as in an acoustic system, which employs a fast Fourier transform to transform input data represented in the time domain into signals represented in the frequency domain to reduce calculations. To solve the problem of a long delay, the impulse response length is divided into a plurality of blocks. Each block then has a decreased number of samples within each block. Thus, a fast Fourier transform and finite impulse response type digital filtering are effected, so that the processing delay is decreased while the amount of calculations is kept small.

12 Claims, 13 Drawing Sheets

CONVOLUTION CALCULATION WITH FFT

ECHO CHANCELLER WITH SHORT PROCESSING DELAY AND DECREASED MULTIPLICATION NUMBER

BACKGROUND OF THE INVENTION

1. Field of the Invention

The present invention relates to an echo canceller with a short processing delay and a decreased number of multiplications.

It is well known that the frequency domain adaptive filter (FDAF) is superior to the time domain adaptive, filter (TDAF) concerning the of computations required. This is more realizable when the filter length is increased, as in the case of the acoustic noise or acoustic echo cancelling in speech communication systems having a long impulse response. The reduction in the computation number is obtained by replacing the convolution in the time domain by multiplication in the frequency domain, using a fast Fourier transform (FFT).

However, to realize a linear convolution of the time domain in the frequency domain, circular convolution must be considered which requires that the FFT use overlapped-save method and a block LMS algorithm. If the length of the block data introduced each time to the system is long, then the input-output, system propagation delay will also be long. If the length of the shifted data is short, then the propagation delay will be short but the multiplication number will be increased. Note, in the FDAF, the FFT length will be too long when the acoustic impulse response is too long. The impulse response of an acoustic echo path is about several hundred millisconds.

Accordingly, for the above reasons, a new echo canceller having a decreased computation number and a short propagation delay is required.

2. Description of the Related Art

The prior art will be explained with reference to FIGS. 9–14.

An echo canceller in the time domain is, as is well known and as shown in FIG. 9, constructed by a digital filter having a finite impulse response (FIR) type having coefficients $\hat{h}_k$ which are the estimated values of an impulse response $h_k$ of an echo path to be estimated, where $k=0, 1, \ldots N-1$, and N is the length of the FIR digital filter.

Each coefficient $\hat{h}_k$ is obtained by an adaptive control in which the difference signal $e(n)$ between an echo signal $y(n)$ passed through the echo path to be estimated and the estimated output $\hat{y}(n)$ of the FIR filter is adaptively controlled to be zero. Known adaptive controls are, a successive adaptive control method and a block adaptive control method. In the successive adaptive control method, the coefficients $\hat{h}_k$ are adaptively updated upon each input of one sample of the input data $x(n)$. In the block adaptive control method, the coefficients are not updated until L samples of the input data have been input, so that the coefficients are updated as a lump at one time when L samples of input data have been received.

In the successive adaptive control method, the necessary multiplication number for each input sample is 2N. That is, N multiplications are necessary for calculating the output signal $\hat{y}(n)$, and N multiplications are necessary for updating the coefficients, resulting in the need for 2N multiplications.

In the block adaptive control method, a fast Fourier transform (FFT) is introduced to effect the processing shown in FIG. 9 in the frequency domain, so that the necessary number of multiplications can be reduced. The FFT by the block adaptive control is well known and is described in, for example, "Fast Implementation of LMS Adaptive Filters" IEEE TRANSACTION ON ACOUSTICS, SPEECH, AND SIGNAL PROCESSING, VOL. ASSP-28, No. 4 AUGUST 1980.

The basic concept thereof is as follows. The convolution expressed by:

$$\hat{y}(n) = \sum_{i=0}^{N-1} h_i \cdot x(n - i) \quad (1)$$

can be considered, as shown in FIGS. 10B–10E, as a sum of products of the input signal $x(n)$ (FIG. 10A) and the respective coefficients, where the coefficient series is shifted by one sample for each input signal $x(n)$. In the figure, N represents the length of the impulse response. Until L samples after one updating, the coefficients are not updated by the adaptive control.

Now, consider a series of the input samples $x(n)$ with a periodic period $(N+L-1)$, each period including $(N+L-1)$ samples $x(n-N+1)$ through $x(n+L-1)$ of the input data $x(n)$, as shown in FIG. 11A. On the other hand, with respect to the coefficients $\hat{h}_k$, a series with a periodic period $(N+L-1)$ is obtained by inserting $(L-1)$ "1"s between the coefficients $\hat{h}_0$ and $\hat{h}_{N-1}$. Then, by shifting the coefficients series one sample by one sample, as shown in FIGS. 11B–11F, $(N+L-1)$.series are obtained. Each sample of the input data $x(n-N+1)$ through $x(n+L-1)$ is multiplied to each of the $(N+L-1)$ series of the coefficients shown in FIGS. 11B–11F. Then, the multiplied results are summed to obtain an output series $z(n)$ having a period of $(N+L-1)$. As is apparent from FIGS. 10A–10E and 11A–11F, the latter half L samples of the series $z(n)$ is equal to the series $\hat{y}(n)$.

In another aspect, the well known cyclic convolution shown in FIGS. 11A–11F is such that the discrete Fourier transform (DFT) of the output is expressed by the products of the DFT of each input. Therefore, the above-mentioned expression (1) can be realized by a constitution shown in FIG. 12.

Referring to FIG. 12, $$(H_k^0, H_k^1, \ldots, H_k^{N+L-2}) = \quad (2)$$

$$FFT(h_0(k), h_1(k), \ldots, h_{N-1}(k), \underbrace{0, \ldots, 0}_{L-1})$$
$$\underbrace{\phantom{FFT(h_0(k), h_1(k), \ldots, h_{N-1}(k),}}_{N}$$

can be written.

That is, an L sample overlap part 121 receives $(N-1)$ samples of one block of input data $x(n)$ and L samples of the previous block of input data, to generate $(N+L-1)$ samples of overlapped elements in which L samples of the input data are overlapped. An $(N+L-1)$-point FFT 122 effects a fast Fourier transform on the $(N+L-1)$ samples with the overlapped L elements to generate $(N+L-1)$ elements of $X_0(k)$, $X_1(k)$, $X_{(N-1)}(k)$, $X_N(k)$, $\ldots$, $X_{(N+L-2)}(k)$. To the outputs $X_0(k), X_1(k), \ldots$, estimated coefficients $H_k^0, H_k^1, \ldots, H_k^{N+L-2}$ are respectively multiplied, where the estimated coefficients are updated once after introducing each block of data, as described later in more detail. The results of the multiplications are then subject to inverse fast Fourier transform (IFFT) in the $(N+L-1)$-point IFFT 123. The output ŷ(n) is obtained at the outputs of an output processing part 124, by considering only the last half L elements of the outputs of the (N+L−1)-point IFFT 123, or by discarding the first (N−1) elements of the outputs of the IFFT 123. The error signal e(n) is obtained by subtracting the estimated output from the echo signal ŷ(n) transmitted via the echo path. The adaptive control is effected so as to reduce the error signal e(n) to zero.

The update control of the coefficients $H_k^i$ is as follows.

The equation for the update control of the coefficients is expressed as:

$$\begin{bmatrix} h_0((k+1) \cdot L) \\ h_1((k+1) \cdot L) \\ \cdot \\ \cdot \\ \cdot \\ h_{N-1}((k+1) \cdot L) \end{bmatrix} = \begin{bmatrix} h_0(k \cdot L) \\ h_1(k \cdot L) \\ \cdot \\ \cdot \\ \cdot \\ h_{N-1}(k \cdot L) \end{bmatrix} + \quad (3)$$

$$2\mu \begin{bmatrix} \sum_{l=0}^{L-1} e(k \cdot L + l) \cdot x(k \cdot L + l) \\ \sum_{l=0}^{L-1} e(k \cdot L + l) x(kL + l - 1) \\ \cdot \\ \cdot \\ \cdot \\ \sum_{l=0}^{L-1} e(k \cdot L + l) x(kL + l - N + 1) \end{bmatrix}$$

The calculation of the second term in the right hand side of the above equation is effected, as shown in FIGS. 13A–13F, as follows. That is, consider a series of the input data x(n) with a period (N+L−1), and consider a series with (N+L−1) period including L samples of error data e(n), e(n+1), . . . , e(n+L−1) and (N−1) "0"s padded. Each element of the input data series x(n-N+1), . . . , x(n+L−1) is multiplied to the series including the error data and the "0"s.

The series with the (N+L−1) period including error data and "0"s is shifted one element by one element in response to an input data sample so that (N+L−1) series are obtained as..shown in FIGS. 13B–13F. Then, each element of the input data series in the (N+L−1) period is multiplied with each of the (N+L−1) series shown in FIGS. 13B–13F, and the sum of the products is obtained from this sum, the preceding N samples are output as the second term of the right-hand side, of the equation (3).

A theory is known in which a periodic correlation function is obtained by the product of the DFT of one input and the complex conjugate of the DFT of the other input (see, for example, "Theory and Application of Digital Signal Processing" written by R. Rabiner and B. Gold, published in 1975 by PRENTICE-HALL Inc., N.J., pg. 403).

FIG. 14 is a block diagram of a conventional echo canceller using the block LMS algorithms and including the updating portion of the coefficients utilizing the above mentioned theory. In FIG. 14, 140 is an overlap processing part; 141 is an (N+L−1)-point FFT; 142 is a complex multiplication part; 143 is an (N+L−1) point inverse FFT; 144 is an output processing part for outputting the last L samples; 145 is a zero padding part; 146 is an (N+L−1) point FFT, 147 is a complex multiplication part; 148 is an IFFT; and 149 is an FFT.

Assuming that the response length is N, then the overlap processing part 140 receives an input signal x(n) and makes (N+L−1) samples as one block. Then, by overlapping L samples of one block and the successive block, the overlap processing part 140 outputs (N+L−1) samples of the input data x(n).

The (N+L−1) point FFT 141 receives each block of the input data x(n) to carry out a Fourier transform on each received block so that the input data x(n), which is represented in the time domain, is transformed to the signals $X_0(k)$, $X_1(k)$, . . . $X(N+L−2)(k)$, which are represented in the frequency domain. In the complex multiplication part 142, the coefficients $H_k^0$, $H_k^1$, . . . , $H_k^{N+L-2}$ are respectively multiplied to the signals $X_0(k)$, $X_1(k)$, . . . , $X(N+L−2)$ in the frequency domain. The (N+L−1) point IFFT 143 receives the results of the multiplications and transforms the signals from the frequency domain representation to the time domain representation.

The output processing part 144 receives the (N+L−1) samples of the time domain representation and outputs the last L samples thereof. The output signal y(n) is subtracted from the echo signal y(n), which has passed through the acoustic echo path, resulting in an error signal e(n).

The error signal e(n) has L samples. In the zero padding part 145, (N−1) "0"s are padded in the portion preceeding the L samples of the error signal e(n). The (N+L−1) point FFT 146 receives the (N+L−1) samples of the "0"s and error signal e(n) to transform them into signal $D_k^0$, $K_k^1$, . . . , $D_k^{(N+L-2)}$ in the frequency domain.

At the complex multiplication part 147, the signals $E_k^0$, $E_k^1$, . . . , $E_k^{(N+L-2)}$ and the complex conjugatesof the signals $X_0(k)$, $X_1(k)$, $X_{(N+L-2)}k$ are respectively multiplied. The multiplied results are applied to the IFFT 148 so that the signals are transformed from the frequency domain representation to the time domain representation. The preceeding N samples of the output of the IFFT 148 are supplied to the FFT 149. In addition, the FFT 149 receives (L−1) samples of "0"s as the last (L−1) samples of the input signal. Thus, at the output of the IFFT 149, updating parts of the tap coefficients $H_k^0$, $H_k^1$, . . . , $H_k^{(N+L-2)}$ are obtained. The tap coefficients are once obtained are updated, or in other words refreshed, after introducing each block of the input data x(n).

The refreshing of the tap copefficients is further described. The tap coefficients are updated at ach input of one block. Assuming that the L samples constitute one adaption block, and assuming that k is an integer, then, as the coefficient values in the period between kL and {KL+(L−1)}, the values of which were updated at the time KL, are used. The next coefficient values at the next time (K+1) are determined in such a way that the sum of the squares of the errors during the period between KL and {KL+(L−1)} is made minimum. In this case, assuming that the evaluation number is D, then, $$D = e_{KL}^2 + e_{KL+1}^2 + \ldots + e_{KL+(L-1)}^2 \quad (4) \text{ can be obtained.}$$

The error $e_{KL+i}$ can be expressed as:

$$e_{KL+l} = \sum_{i=0}^{N-1} (h^i - h^i_{KL}) X_{KL+l-i} \qquad (5)$$

where $h^i$ represents an impulse response of the actual system; $h_{KL}{}^i$ represents an estimated impulse response; and $X_{KL+l-i}$ represents a sample of the series of the input data. Whereas, the following equation stands.

$$-\frac{\partial D}{\partial h^i} = 2 \sum_{l=0}^{L-1} e_{KL+l} X_{KL+l-i} \qquad (6)$$

Therefore, the updating of the coefficients is expressed by $$h^i_{(K+1)L} = h^i_{KL} + 2\mu \sum_{l=0}^{L-1} e_{KL+l} X_{KL+l-i} \qquad (7)$$

where $\mu$ is a constant value. Expression of the equation (7) in the vector form is as follows:

$$\begin{bmatrix} h^0_{(K+1)L} \\ h^1_{(K+1)L} \\ \cdot \\ \cdot \\ \cdot \\ h^{N-1}_{(K+1)L} \end{bmatrix} = \begin{bmatrix} h^0_{KL} \\ h^1_{KL} \\ \cdot \\ \cdot \\ \cdot \\ h^{N-1}_{KL} \end{bmatrix} + 2\mu \begin{bmatrix} \sum_{l=0}^{L-1} e_{KL+l} X_{KL+l} \\ \sum_{l=0}^{L-1} e_{KL+l} X_{KL+l-1} \\ \cdot \\ \cdot \\ \cdot \\ \sum_{l=0}^{L-1} e_{KL+l} X_{KL+l-(N-1)} \end{bmatrix} \qquad (8)$$

In the algorithm utilizing an FFT, assume that:

$$y_{KL+l} = \sum_{i=0}^{N-1} h^i_{KL} X_{KL+l-i} \qquad (9)$$

$$H_K^T = (h^0_{KL}, h^1_{KL}, \ldots, h^{N-1}_K, 0, 0, \ldots) \qquad (10)$$

$$X_K^T = (x_{KL-(N-1)}, \ldots, x_{KL-1}, x_{KL}, \ldots, x_{KL+(L-1)}) \qquad (11)$$

$$Y_K^T = (y_{KL}, y_{KL+1}, y_{KL+2}, \ldots, y_{KL+(L-1)}) \qquad (12)$$

Then, the output vector $Y_K^T$ is obtained by the latter half L samples of the cyclic convolution with a periodic period equal to $(N+L-1)$ of the vectors $H_K^T$ and $X_K^T$ expressed by the equations (10) and (11). The FFT of the output of the cyclic convolution is the products of the FFT of each element which is subject to convolution. Therefore, the fundamental structure of the echo canceller shown in FIG. 14 is constructed by the parts 140–144. The coefficients $H_K^0$–$H_K^{(N+L-2)}$ are updated by the outputs of the FFT 149. To update the coefficients, $(L-1)$ zeros are padded in the FFT 149 to the second term in the equation (8), which is thus changed as follows.

$$\begin{bmatrix} \sum_{l=0}^{L-1} e_{K,L+l} X_{K,L+l} \\ \sum_{l=0}^{L-1} e_{K,L+l} X_{K,L+l-1} \\ \sum_{l=0}^{L-1} e_{K,L+l} X_{K,L+l-(N-1)} \\ 0 \\ \cdot \\ \cdot \\ \cdot \\ 0 \end{bmatrix} \qquad (13)$$

It is known that the IFFT 148 and the FFT updating the coefficients can be omitted (see "Unconstrained Frequency-Domain Adaptive Filter" D. Mansour et al., IEEE vol ASSP-30, No. 5, October 1982).

In the construction shown in FIG. 14, the necessary number of multiplications for each input of one sample is expressed as follows:

$$\frac{N+L-1}{L}\left\{5\log_2\left(\frac{N+L-1}{2}\right) + 14\right\} \qquad (14)$$

where $(N+L-1)$ is assumed to be an n-th power of 2. By the equation proposed by Mansour et al., this is expressed as:

$$\frac{N+L-1}{L}\left\{3\log_2\left(\frac{N+L-1}{2}\right) + 10\right\} \qquad (15)$$

On the other hand, by a usual adaptive control effected sample by sample in the time domain, the necessary number of multiplications is as large as 2N.

When L and N are nearly equal in order of magnitude, the value expressed by the equation (14) or (15) is small in comparison with the number 2N.

However, in an echo canceller for an acoustic system, the length of the impulse response is so long that the number N becomes several thousand or more. Whereas, the block length L should be as small as possible, because it provides, as it is, a processing delay, and in order to minimize the influence due to fluctuation of the system. If L is sufficiently small in comparison with N, the value expressed by the equation (14) or (15) becomes almost equal to or larger than 2N.

Also, if $(N+L-1)$ is not an n-th power of 2, the echo canceller having the structure shown in FIG. 14 cannot operate effectively. For example, assume that N=4096 and L=50, then the FFT portion shown in FIG. 14 must be arranged to execute 8096 multiplications resulting in an increase in the processing delay.

SUMMARY OF THE INVENTION

In view of the above problems in the prior art, an object of the present invention is to provide a new echo canceller in which the number of multiplications is decreased and the processing delay is shortened.

To attain the above object, there is provided, according to the present invention, an echo canceller for cancelling an echo signal passed through an echo path with an impulse response N, having an input end for receiving an input digital signal series and an output end for providing an error signal. The echo canceller comprises an N' sample overlap processing part 10, connected to the input end, for receiving the input digital signal series, and for outputting 2N' samples of said input digital signal series with N' samples being overlapped; a 2N'-point fast Fourier transform part, connected to the N' sample overlap processing part, for effecting a fast Fourier transform on the 2N' samples output from the overlap processing part so as to output 2N' points of signals expressed in the frequency domain; an FIR filtering part for dividing said impulse response N in said input digital signal series into k blocks each consisting of N' samples where k and N are integers, connected to the 2N'-point fast Fourier transform part, for adding the multiplied output signals of said 2N'-point fast Fourier transform part; a coefficient updating part, connected to the output end, for updating the coefficient of the FIR filtering part; a 2N'-point inverse fast Fourier transform part, connected to the FIR filtering part, for effecting an inverse fast Fourier transform on the output of the FIR filtering part; an output processing part, connected to the 2N'-point inverse fast Fourier transform part (15), for deleting the first N' samples from the outputs of the 2N'-point inverse fast Fourier transform part and for outputting the last N' samples as an estimated echo signal; a delay circuit, connected to the echo path, for delaying the echo signal passed through the echo path by the N' samples; and a subtractor, connected to the output processing part and the delay circuit, for obtaining an error signal corresponding to the difference between the output of the delay circuit and the estimated echo signal.

DESCRIPTION OF THE PREFERRED EMBODIMENTS

Figure 1:
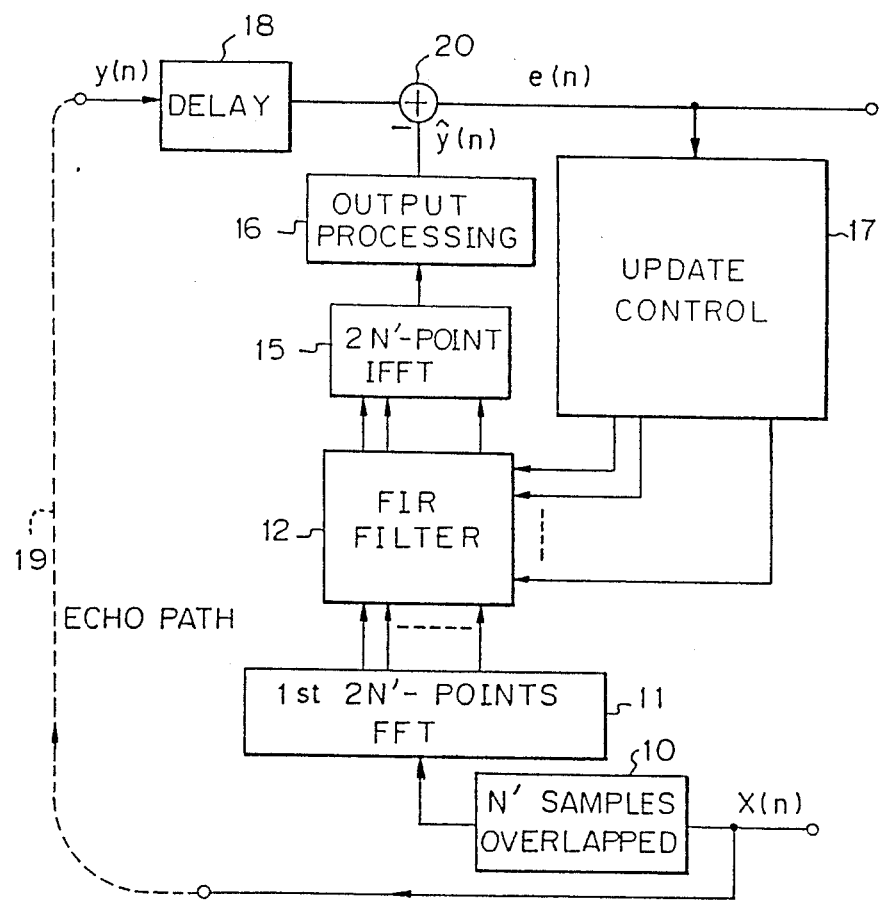
FIG. 1 is a block diagram showing a general structure of an echo canceller according to an embodiment of the present invention.

FIG. 1 illustrates a general structure of an echo canceller according to an embodiment of the present invention. In the figure, a tap number N, which is determined by the impulse response of the system to be estimated, is considered to consist of k blocks of N' samples. Assuming that a frame unit consists of $N/k = N'$ samples, then, the part 10 outputs 2N' samples (or 2 frames) in which N' samples are overlapped in the current input and the preceding input. A first 2N'-point FFT 11 receives the 2N' samples from the part 10 to effect a fast Fourier transform on the 2N' samples so that the signals in the time domain are converted into the signals in the frequency domain.

In a finite impulse response (FIR) filter 12, each of the 2N' points output from the first 2N'-point FFT 11 is delayed by $N' \times P$ samples, where $0 \leq P \leq k-1$. The delayed 2N' samples are respectively multiplied with coefficients output from an update control part 17, and the multiplied outputs are added to obtain 2N' outputs of the FIR filter 12. A 2N' points IFFT effects an inverse FFT on the 2N' outputs from the FIR filter 12 so that the signals of 2N' samples in the frequency domain are converted into signals in the time domain. An output processing part 16 deletes the first half N' samples from the outputs of the 2N' points IFFT 15 and outputs the last N' samples.

The update control part 17 effects an updating process of the coefficients of the FIR filter 12. A delay circuit 18 receives an echo component y(n) passed through the echo path 19 and delays it by N' samples. A subtractor 20 subtracts the output of the last N' samples of the output processing part 16 from the output of the delay circuit 8 to obtain error signals.

Since the FIR filtering is executed on the shortened block of N' samples by dividing the impulse response having the length N into k blocks, the process delay is greatly shortened while the merits of the echo canceller utilizing FFT, i.e., the small number of multiplications, are maintained. It should be noted that the estimated value ŷ(n) is considered to be a sum of the convolution of each block and the input data x(n) when the impulse response length of the system to be estimated is N, which is divided into the blocks each having N' samples.

The basic concept of the present invention is described with reference to FIGS. 2 to 4.

Figure 2:
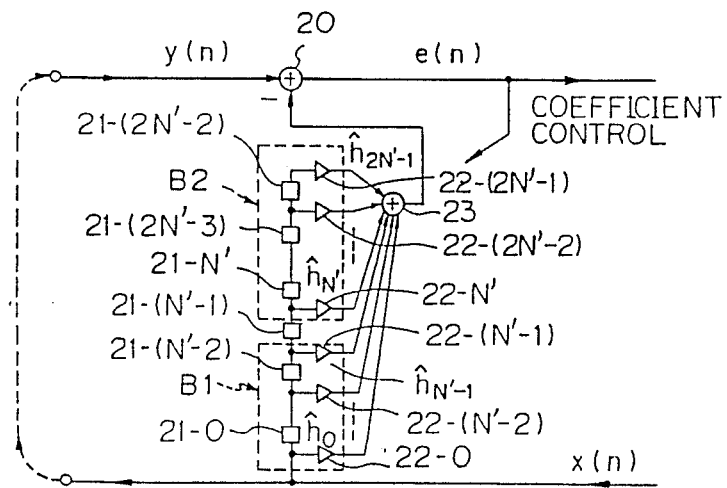
FIG. 2 is a diagram showing a an FIR filter having a tap number 2N', for explaining the basic idea of the present invention.

FIG. 2 shows an FIR filter having a tap number 2N'. In the figure, 21-0 through 21-(2N'−2) are delay elements, each providing one sample of delay for the input signal x(n). 22-0 through 22-(2N'−1) are multipliers, each operating to multiply the input sample and an estimated value $\hat{h}_k$ of the impulse response $h_k$ of the system to be estimated, where $k = 0, 1, 2, \ldots,$ or $2N'-1$. The multiplied results are added by an adder 23. The added result is subtracted from the echo-signal y(n) by a subtractor 20 to obtain an error signal e(n). An adaptive control is effected to make the error signal e(n) zero.

The FIR filter having the tap number 2N' shown in FIG. 2 can be considered to be a composite filter including a block B1 with a tap number N' and a block B2 with a tap number N'. Therefore, the FIR filter shown in FIG. 2 can be expressed as shown in FIG. 3.

Figure 3:
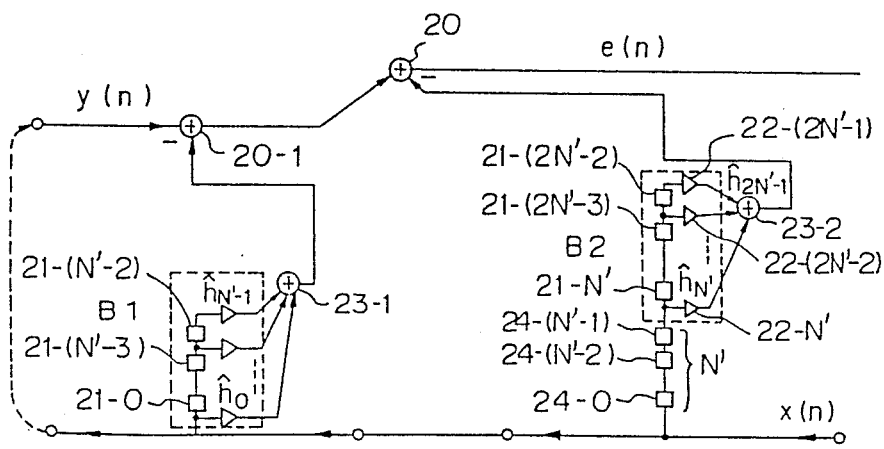
FIG. 3 is an equivalent circuit of the FIR filter shown in FIG. 2, for explaining the basic idea of the present invention.

In FIGS. 2 and 3, the same reference symbols represent the same parts. The left side of FIG. 3 includes the block B1, and the right side of FIG. 3 includes the block B2. The outputs of the block B1 are added by an adder 23-1, and the output of the adder 23-1 is subtracted from the echo signal y(n) by a subtractor 20-1. The input signal x(n) is delayed by N' samples by delay elements 24-0 through 24-(N'−1) to be inputted into the block B2. The outputs of the block B2 are added by an adder 23-2, and the output of the adder 23-2 is subtracted from the output of the subtractor 20 to provide the error signal e(n).

Figure 14:
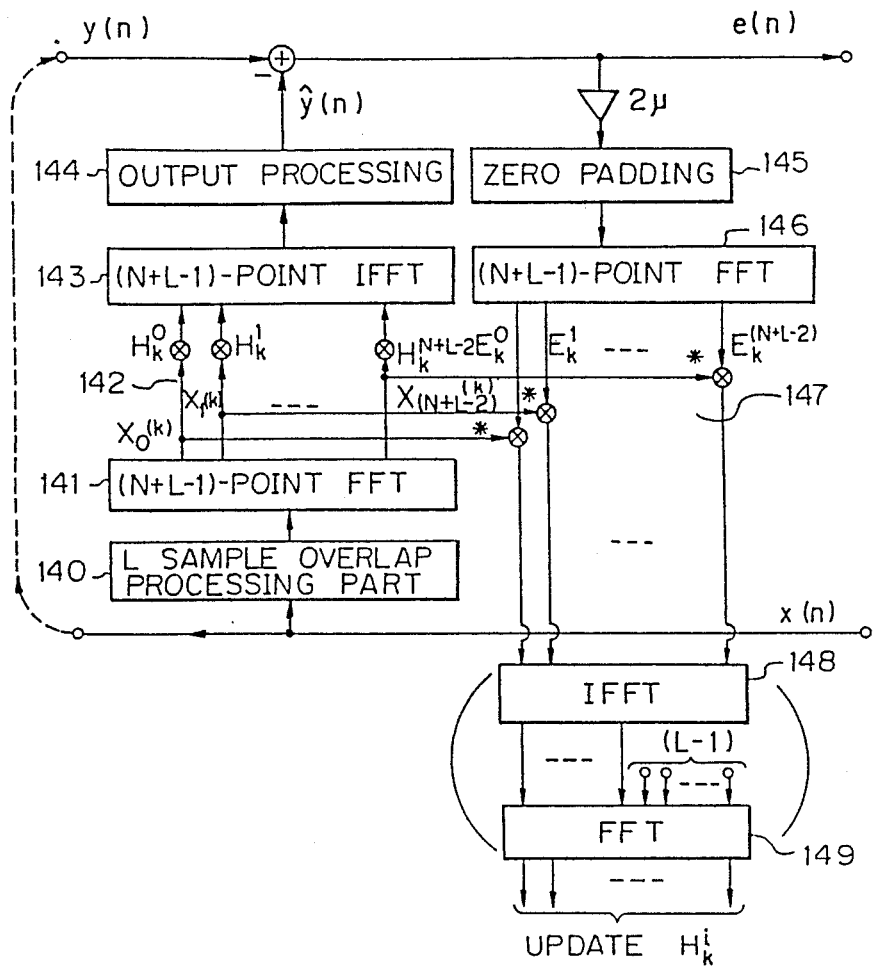
FIG. 14 is a block diagram showing a conventional echo canceller with FFT and block adaptive control.

The constitution of the circuit in the right side or in the left side in FIG. 3 is substantially the same as the conventional constitution shown in FIG. 14 except for the number of samples to be processed. Accordingly, the detailed construction of the echo canceller shown in FIG. 3 can be depicted as the construction shown in FIG. 4.

Figure 4:
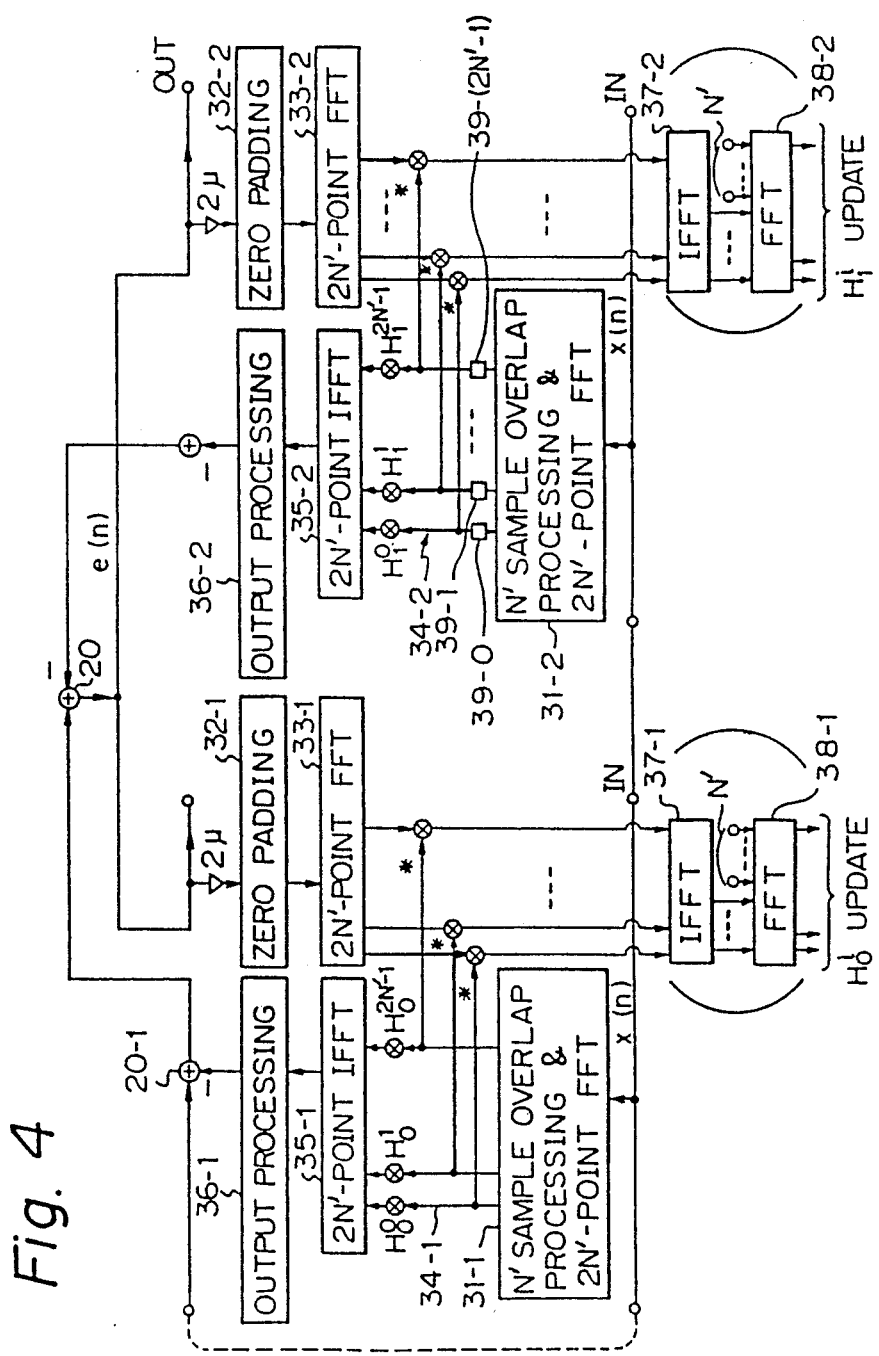
FIG. 4 is a block diagram showing an echo canceller including the FIR filter shown in FIG. 3, for explaining the basic idea of the present invention.

In FIG. 4, reference symbols 31-1 and 31-2 are N' overlap processing parts and 2N'-point FFTs; 32-1 and 32-2 are zero padding parts for padding N' zeros to the portion preceding the error signal e(n) at the output OUT; 33-1 and 33-2 are 2N' point FFT processing parts for effecting FFT on the outputs of the zero padding parts 32-1 and 32-2; 34-1 and 34-2 are coefficients multiplying parts or, in other words, FIR filtering parts; 35-1 and 35-2 are 2N' points inverse FFT processing parts; 36-1 and 36-2 are output processing parts for outputting the last N' samples by deleting the preceding N' samples; 37-1 and 37-2 are inverse FFT processing parts; and 38-1 and 38-2 are FFT processing parts The IFFT processing parts 37-1 and 37-2 and the FFT processing parts 38-1 and 38-2 operate to provide the updated coefficients $H_0^i$ and $H_1^i$. As mentioned before in the description of the prior art, the IFFT processing parts 37-1 and 37-2 and the FFT processing parts 38-1 and 38-2 for updating the coefficients can be omitted.

The difference between the left side circuit and the right side circuit in FIG. 4 is that the outputs of the part 31-2 are respectively delayed by one sample by delay elements 39-0, 39-1, . . . , and 39-(2N'−1). This corresponds to the N' samples of the delay elements shown in the right side circuit in FIG. 3.

Figure 5:
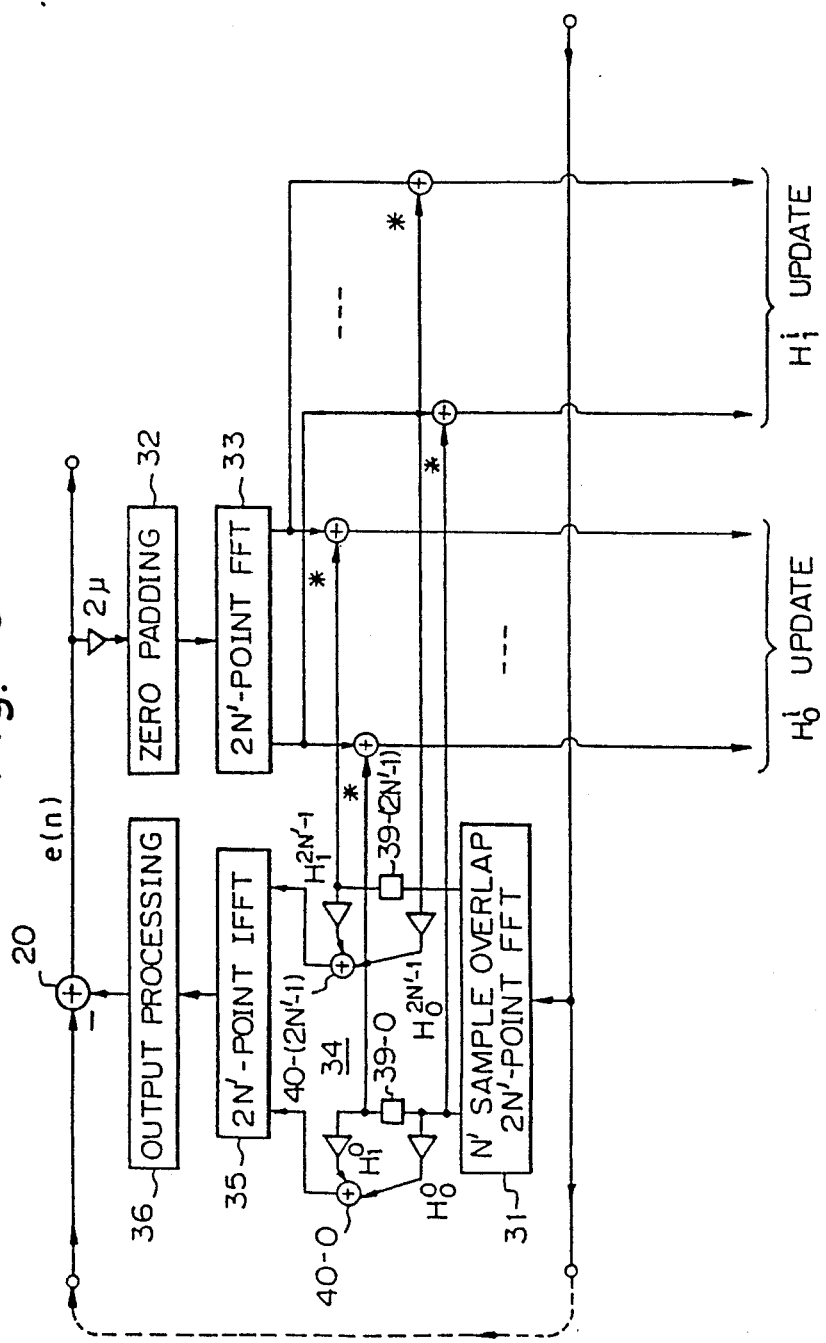
FIG. 5 is a block diagram showing an echo canceller realized by the basic idea shown in FIGS. 2 and 3, according to an embodiment of the present invention.

FIG. 5 shows an equivalent system to the construction shown in FIG. 4 except that the IFFT processing parts 37-1 and 37-2 and the FFT parts 38-1 and 38-2 in FIG. 4 are omitted in FIG. 5 and the separate parts 31-1 and 31-2, 32-1 and 32-2, 33-1 and 33-2, 34-1 and 34-2, 35-1 and 35-2, 36-1 and 36-2 in FIG. 4 are respectively combined as unit parts 31 through 36 in FIG. 5.

In FIG. 5, the FIR filtering part 34 has two-divided portions as already shown in FIG. 2. In one of the two-divided portions, the 2N' outputs of the N' sample overlap processing part and the 2N' point FFT 31 and the estimated coefficients $H_0^0$ through $H_0^{2N'-1}$ are multiplied to obtain these products. In another one of the two-divided portions, the above-mentioned 2N' outputs are delayed by the delay elements 39-0 through 39-(2N'−1). Then, the delayed outputs are multiplied to the estimated coefficients $H_1^0$ through $H_1^{2N'-1}$ to obtain these products. The products with respect to the first output are summed by the adder 40-0. Similarly, the products with respect to the second, third, . . . , and (2N'−1)th outputs are respectively summed by the corresponding adders 40-1 through 40-(2N'−1). Thus, at the outputs of these adders 40-0 through 40-(2N'−1), 2N' outputs of the FIR filter 34 are obtained.

By the system construction shown in FIG. 5, the input signal having the impulse response of N samples is divided into two so that the processing is effected on each block with N' samples, and the process delay is shortened to be N' samples.

In the above-described embodiment of the present invention, the FIR filter is divided into only two for the sake of simplicity of the description. The present invention, however, is not restricted to the above embodiment, and similar considerations are possible even when the number of divisions is increased.

FIGS. 6A through 6F are diagrams for explaining the concept of dividing the FIR filter into k blocks.

Figure 6:
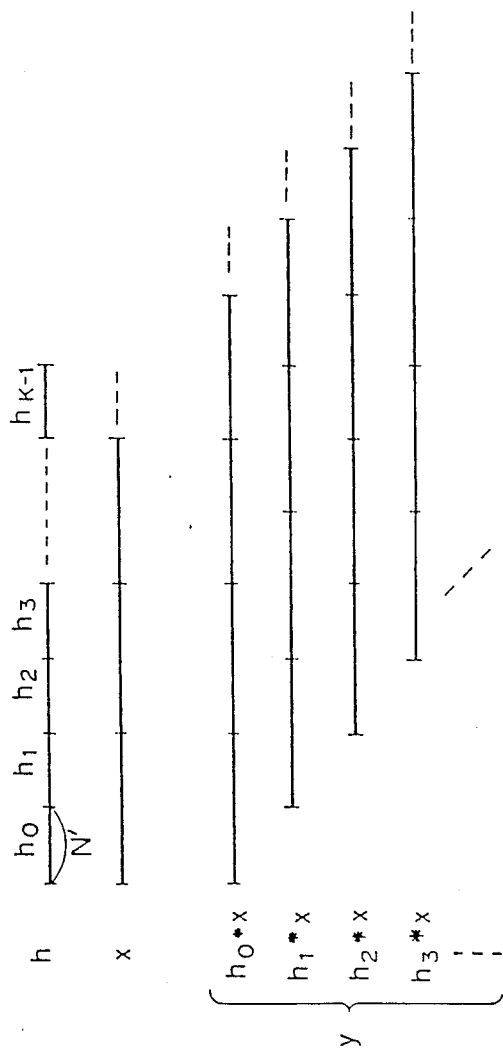
FIG. 6 is a diagram for explaining the concept of dividing the FIR filter into k blocks, according to an embodiment of the present invention.

As shown in FIG. 6A, the estimated impulse response h is divided into k blocks $h_0, h_1, \ldots, h_{k-1}$, each block consisting of N' samples. FIG. 6B shows the input signal x. The output of the FIR filter is the sum of the convolutions of each block $h_i$ and the input signal x. The convolutions are shown in FIGS. 6C, 6D, 6E, 6F, . . . as the expressions $h_0*x, h_1*x, \ldots$ and $h_{k-1}*x$.

For each component $h_i$ of the impulse response, the convolution output is delayed by ixN' samples. Therefore, under the assumption that the updating period of the tap coefficients of the block LMS algorithm is N' samples, the output of the FFT for i-th block must be delayed by i samples.

Figure 7:
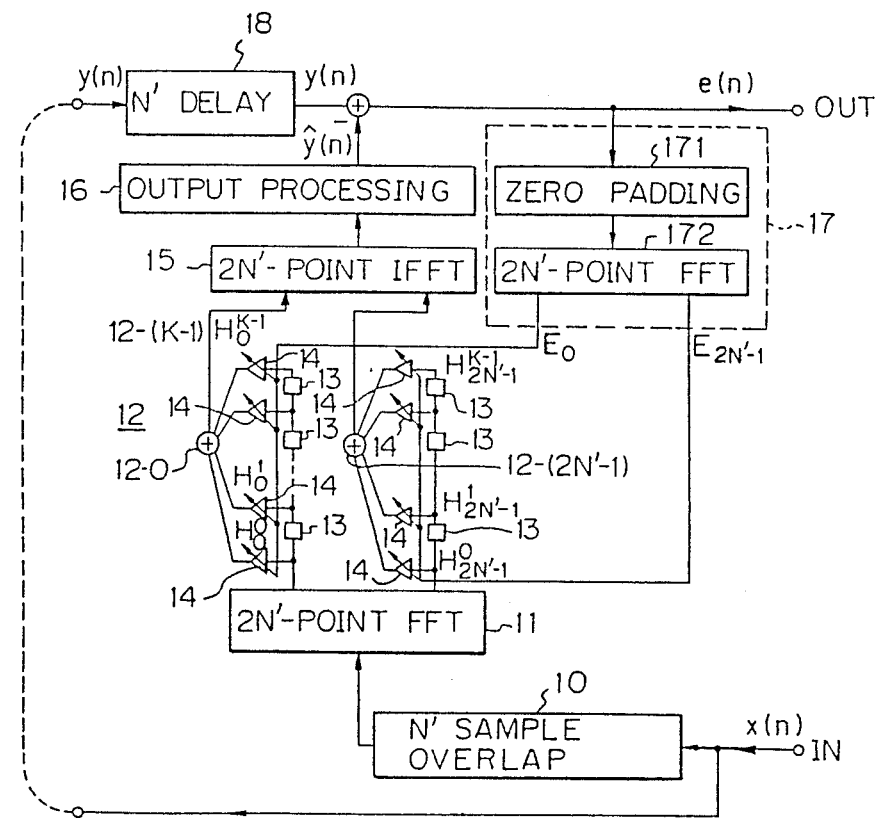
FIG. 7 is a block diagram showing an echo canceller realized by the concept shown in FIG. 6, according to another embodiment of the present invention.

FIG. 7 is a block diagram showing an echo canceller in which an FIR filter is divided into k blocks, taking into account the considerations described with reference to FIGS. 6A through 6F, according to another embodiment of the present invention.

Figure 13:
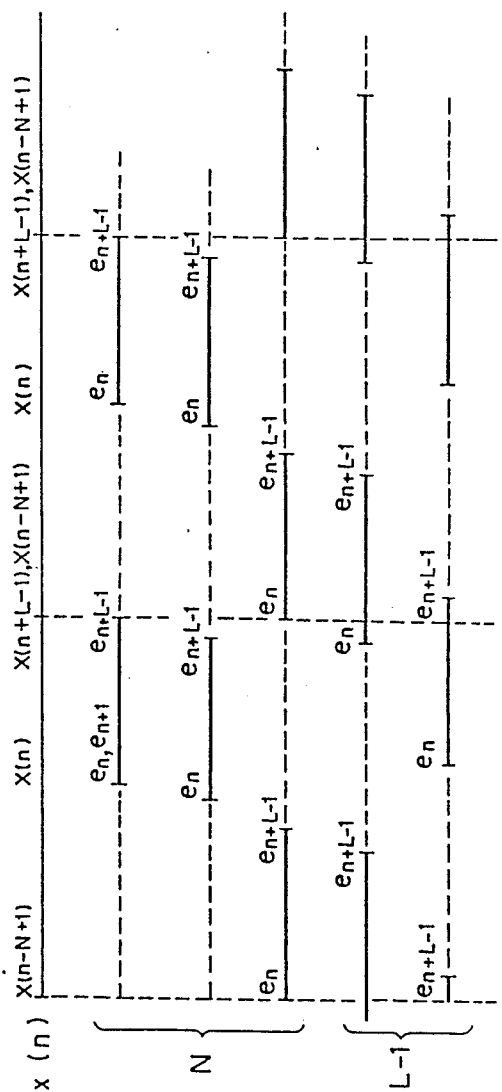
FIGS. 13A to 13F are diagrams for explaining the updating of the coefficients in a block adaptive control.

In FIG. 7, the construction is similar to the conventional one shown in FIG. 13 except that, in FIG. 7, the number of samples in one block is N' and the FIR filter includes k delay elements 13 connected in series for each block. The tap coefficient between two delay elements 13 is multiplied by a multiplier 14 to the estimated coefficient $H_i^j$, where $i=0, 1, \ldots,$ or $2N'-1$ and $j=0, 1, \ldots,$ or $k-1$. The multiplied results are summed by adders 12-0 through 12-(2N'−1). Reference number 10 represents an N' sample overlap processing part; 11 is a 2N' point FFT processing part; 15 is a 2N' point IFFT processing part; 16 is an output processing part for deleting the preceding N' samples and outputting the latter half N' samples; 17 is a coefficient updating part; 171 is a zero padding part for padding N' zeros into the preceding half N' samples of the error signal e(n); and 172 is a 2N' point FFT processing part for processing the output of the zero padding part 171.

In FIG. 7, the constitution of the coefficient updating part 17 is simple because the IFFT 37-1 or 37-2 and the FFT 38-1 or 38-2 are omitted.

The operation of the echo canceller shown in FIG. 7 is as follows.

The input signal x(n) from the input terminal IN is processed by the N' sample overlap processing part 10 so that a unit consisting of 2N' samples of the input signals is output at each output timing. In the overlapping process, the latter half N' samples of the current unit of 2N' samples are overlapped with the preceding half N' samples of the immediately previous output (see FIGS. 6B through 6F). The 2N' samples output from the N' sample overlap processing part 10 are received by the 2N' point FFT processing part 11 and are processed by a fast Fourier transform so that the input signal expressed in the time domain is transformed into the signal expressed in the frequency domain. The complex conjugates of the 2N' outputs from the 2N'-point FFT processing part 11 are respectively multiplied with the error coefficients $E_0$ through $E_{2N'-1}$ which are output from the 2N'-point FFT processing part 172 in the coefficient updating part 17 at the error signal side, resulting in the updating parts of the coefficients $H_0^0$ through $H_{2N'-1}^0$ which correspond to the block $h_0$. With respect to the outputs which are delayed by one sample by the delay elements 13, the complex conjugates thereof are multiplied with the error coefficients $E_0$ through $E_{2N'-1}$ so that the updating parts of the coefficients $H_0^1$ through $H_{2N'-1}^1$ corresponding to the block $h_1$ are obtained. Similarly, the updating parts of the coefficeints $H_0^i$ through $H_{2N'-1}^i$ corresponding to the blocks $h_i$ (where $i=2, 3, \ldots,$ or $k-1$) are obtained. The coefficients obtained in such a way as above are classified into groups respectively corresponding to the outputs of the 2N' point FFT processing part 11. Then, the multiplied data by the classified coefficients $H_0^0$ through $H_0^{k-1}$, $H_1^0$ through $H_1^{k-1}$, ... and $H_{2N'-1}^0$ through $H_{2N'-1}^1$ are summed respectively by the adders 12-0 through 12-(2N"1). The adder results are input to the 2N' point IFFT processing part 15 and are processed therein by an inverse fast Fourier transform. Then, in the output processing part 16, the preceding half N' samples are deleted so that the last half N' samples are output as the estimated echo signal $\hat{y}(n)$. By subtracting the value $\hat{y}(n)$ from the echo signal $y(n)$ passed through the echo path, the error signal $e(n)$ is obtained.

Since the impulse response is divided into a plurality of blocks, each block consisting of N' samples, the delay in the N' delay circuit 18 can be made as short as N'. The delay N' can be made smaller and smaller by increasing the number of divided blocks so that the processing delay can be reduced.

Figure 8:
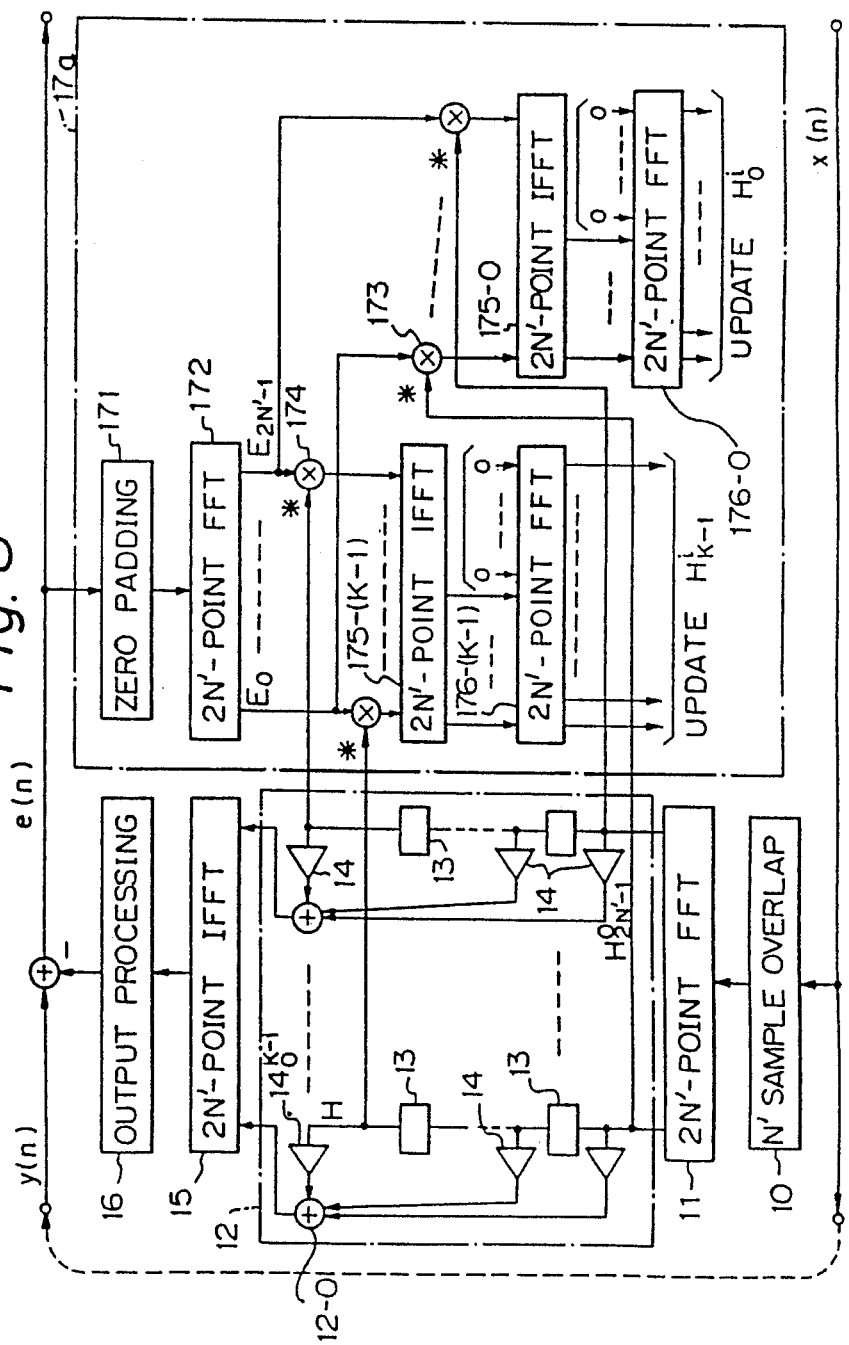
FIG. 8 is a block diagram showing an echo canceller according to still another embodiment of the present invention.
Figure 9:
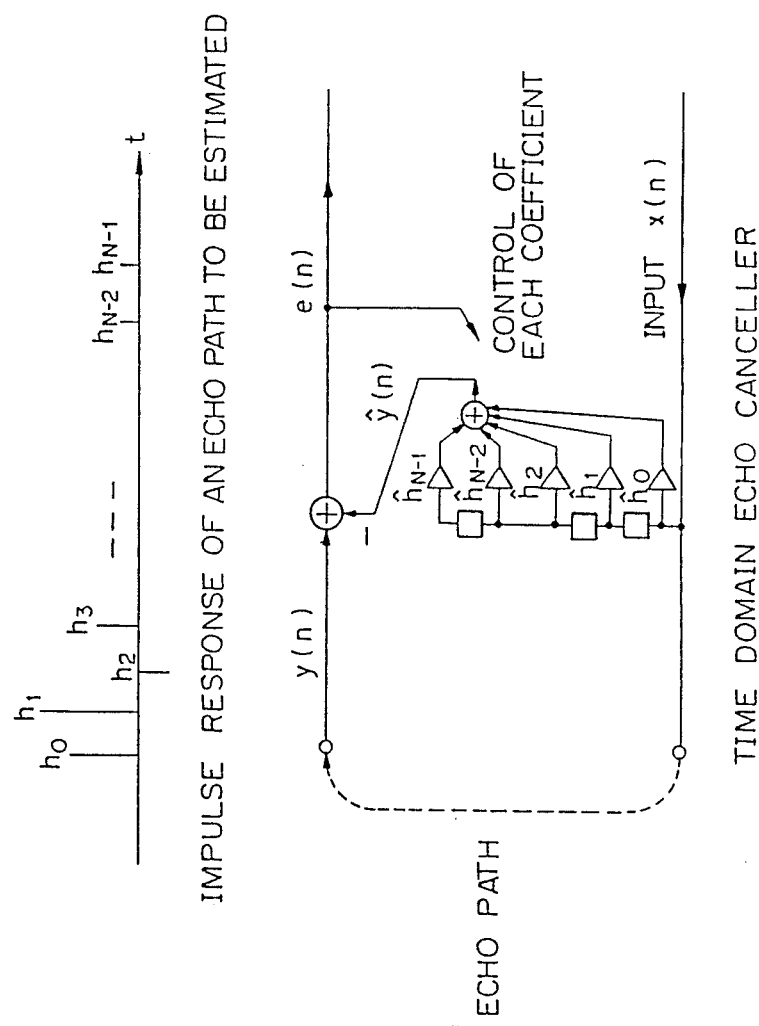
FIG. 9 is a diagram showing a conventional time domain echo canceller.
Figure 10:
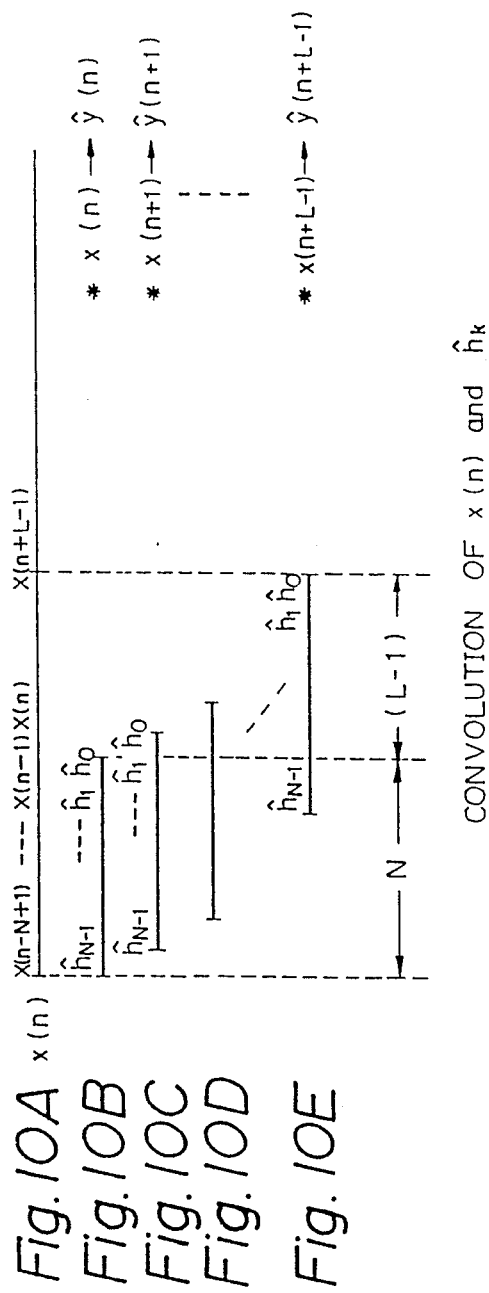
FIGS. 10A to 10E are diagrams for explaining a conventional calculation of a convolution.
Figure 11:
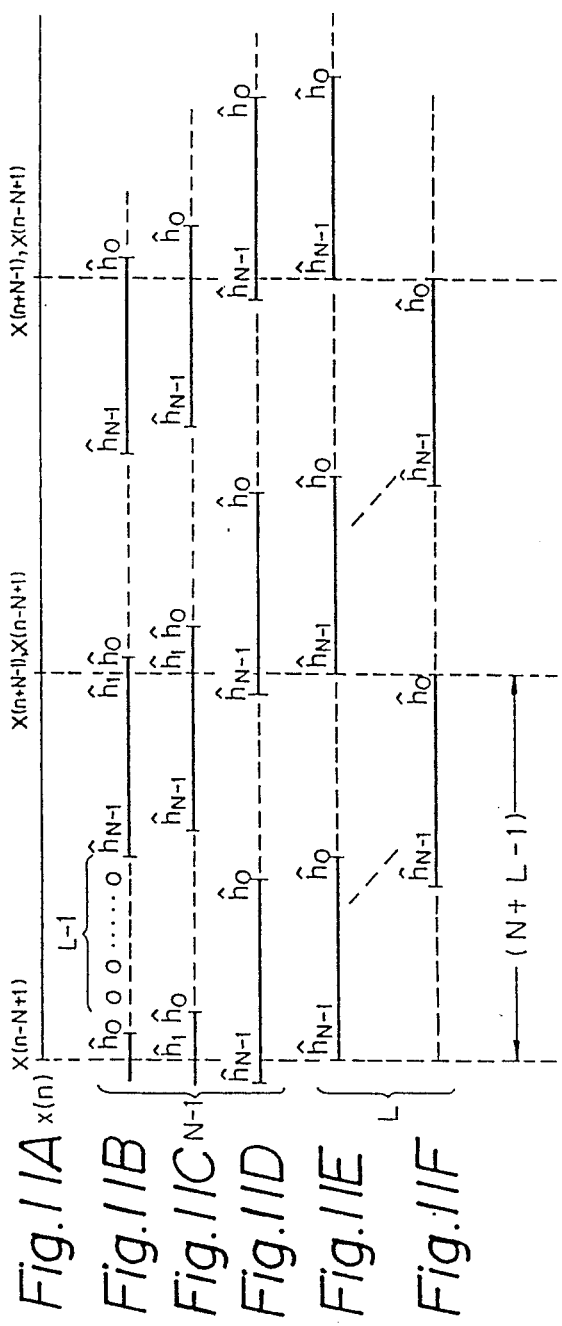
FIGS. 11A to 11F are diagrams for explaining a conventional calculation of a cyclic convolution.
Figure 12:
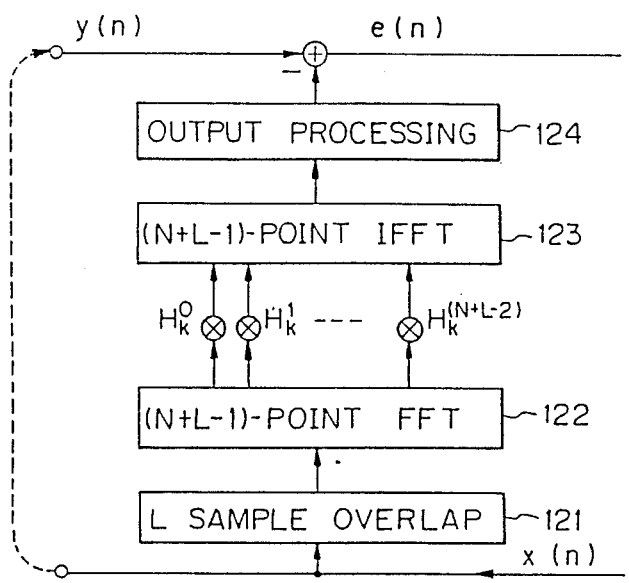
FIG. 12 is a block diagram showing a conventional convolution calculation control utilizing FFT.

In the embodiment shown in FIG. 7, the coefficient updating part 17 is simplified. FIG. 8 shows an another embodiment of the present invention in which only a coefficient updating part 17a is different from the coefficient updating part 17 shown in FIG. 7. The other parts are similar to those shown in FIG. 7.

In FIG. 8, the coefficient updating part 17a includes the zero padding part 171, the 2N'-point FFT processing part 172, multipliers 173, 174, ..., 2N'-point IFFT processing parts 175-0 through 175-(k-1), and 2N'-point FFT processing parts 176-0 through 176-(k-1)

By the coefficient updating part 17a shown in FIG. 8, the coefficients $H_k^i$, where $k=0, 1, 2, \ldots,$ or $2N'-1$, and $i=0, 1, 2, \ldots,$ or $k-1$, can be derived by dividing the conventional equation (3) into a plurality of blocks each consisting of N' samples, as follows.

$$\begin{bmatrix} H_{(k+1)\cdot N'}^0 \\ H_{(k+1)\cdot N'}^1 \\ \cdot \\ \cdot \\ \cdot \\ H_{(k+1)\cdot N'}^{N'-1} \end{bmatrix} \begin{bmatrix} H_{k\cdot N'}^0 \\ H_{k\cdot N'}^1 \\ \cdot \\ \cdot \\ \cdot \\ H_{k\cdot N'}^{N'-1} \end{bmatrix}$$

$$\begin{bmatrix} H_{(k+1)\cdot N'}^{N'} \\ \cdot \\ \cdot \\ \cdot \\ H_{(k+1)\cdot N'}^{2N'-1} \end{bmatrix} = \begin{bmatrix} H_{k\cdot N'}^{N'} \\ \cdot \\ \cdot \\ \cdot \\ H_{k\cdot N'}^{2N'-1} \end{bmatrix}$$

$$\begin{bmatrix} H_{(k+1)\cdot N'}^{2N'} \\ \cdot \\ \cdot \\ \cdot \\ H_{(k+1)\cdot N'}^{kN'-1} \end{bmatrix} \begin{bmatrix} H_{k\cdot N'}^{2N'} \\ \cdot \\ \cdot \\ \cdot \\ H_{k\cdot N'}^{KN'-1} \end{bmatrix}$$

$$+ 2\mu \begin{bmatrix} \sum_{L=0}^{N'-1} e_{k\cdot N'+L} x_{k\cdot N'+L} \\ \sum_{L=0}^{N'-1} e_{k\cdot N'+L} x_{k\cdot N'L-1} \\ \cdot \\ \cdot \\ \sum_{L=0}^{N'-1} e_{k\cdot N'+L} x_{k\cdot N'+L-(N'-1)} \end{bmatrix} \begin{bmatrix} \sum_{L=0}^{N'-1} e_{k\cdot N'+L} x_{k\cdot N'+L-N'} \\ \cdot \\ \cdot \\ \sum_{L=0}^{N'-1} e_{k\cdot N'+L} x_{k\cdot N'+L-(2N'-1)} \end{bmatrix} \begin{bmatrix} \sum_{L=0}^{N'-1} e_{k\cdot N'+L} x_{k\cdot N'+L-2N'} \\ \cdot \\ \cdot \\ \sum_{L=0}^{N'-1} e_{k\cdot N'+L} x_{k\cdot N'+L-(KN'-1)} \end{bmatrix} \quad (16)$$

In the equation (16), the number N' in the coefficient $H_{k,N'}^i$, or $H_{k+1,N'}^i$, denotes that each block consists of N' samples. The m-th block in the above equation plus N' zeros, gives the following equation (17).

$$\begin{bmatrix} H_{(k+1)\cdot N'}^{mN'} \\ H_{(k+1)\cdot N'}^{mN'+1} \\ \vdots \\ H_{(k+1)\cdot N'}^{(m+1)N'-1} \\ 0 \\ 0 \\ \vdots \\ 0 \end{bmatrix} = \begin{bmatrix} H_{k\cdot N'}^{mN'} \\ H_{k\cdot N'}^{mN'+1} \\ \vdots \\ H_{k\cdot N'}^{(m+1)N'-1} \\ 0 \\ 0 \\ \vdots \\ 0 \end{bmatrix}$$

$$+ 2\mu \begin{bmatrix} \sum_{L=0}^{N'-1} e_{k\cdot N'+L} \, x_{k\cdot N'+L-mN'} \\ \sum_{L=0}^{N'-1} e_{k\cdot N'+L} \, x_{k\cdot N'+L-mN'-1} \\ \vdots \\ \sum_{L=0}^{N'-1} e_{k\cdot N'+L} \, x_{k\cdot N'+L-(m+1)N'+1} \\ 0 \\ 0 \\ \vdots \\ 0 \end{bmatrix} \quad (17)$$

By comparing the second term in the above equation (17) with the conventional expression (13), it can be appreciated that the tap coefficients corresponding to the m-th block can be calculated by a structure similar to the conventional one shown in FIG. 14, except that the number of samples to be processed in the coefficient updating part 17a is 2N' which is smaller than the number of samples processed in the conventional coefficient updating part shown in FIG. 14. That is, in the 2N'-point FFT processing part 176-k shown in FIG. 8, N' "0"s are added to the outputs of the IFFT processing part 175-0 so that the updating parts of the coefficients $H_i^k$ (i=0, 1, 2, ..., and 2N'−1) are output. The update of these coefficients is effected in a lump each time N' samples of input data are received.

It should be noted that the functions of the aforementioned parts shown in FIGS. 5 and 8 can be realized by arithmetic functions in a program controlled type processor.

From the foregoing description, it is apparent that, according to the present invention, the necessary numbers of multiplications corresponding to the expressions (14) and (15) are respectively:

$$(4k+6)\log_2 N' + 16k + 12 \quad (18)$$

$$16\log_2 N' + 8k + 12 \quad (19)$$

where k is a number of divisions; N' is the block length to be adapted, and $N = N' \times k$. This value is generally much smaller than 2N even when the processing delay N' is small.

That is, according to the present invention, a block adaptive algorithm can be realized with a smaller number of multiplications than conventionally used. Further, by selecting the value N' to be a power of 2, an effective construction can be realized. That is, the construction shown in FIG. 5, FIG. 7 or FIG. 8 can be said to have a higher flexibility in comparison with the conventional construction.

We claim:

1. An echo canceller for cancelling an echo signal passed through an echo path with an impulse response N, said echo canceller having an input end for receiving an input digital signal series and an output end for providing an error signal, said echo canceller comprising:

N' sample overlap processing means, connected to the input end, for receiving the input digital signal series and for outputting 2N' samples of the input digital signal series with N, samples being overlapped;

first 2N'-point fast Fourier transform means, connected to said N, sample overlap processing means, for effecting a fast Fourier transform on the 2N' samples output from said N' sample overlap processing means to output 2N' points of signals expressed in the frequency domain;

coefficient updating means, operatively connected to the output end, for generating estimates and for updating the estimate coefficients based upon the error signal;

finite impulse response filtering means, operatively connected to said first 2N'-point fast Fourier transform means, for dividing the impulse response N in the input digital signal series into k blocks each consisting of N' samples where k and N are integers, and for delaying the 2N' points of signals output from said first 2N'-point fast Fourier transform to generate delayed signals, respectively multiplying the delayed signals by the estimate coefficients to generate estimate impulse signals, and outputting output frequency response signals as the sum of the estimate impulse signals;

2N'-point inverse fast Fourier transform means, connected to said finite impulse response filtering means, for effecting an inverse fast Fourier transform on the output frequency response signals from said FIR filtering to output an impulse output signal;

output processing means, connected to said 2N'-point inverse fast Fourier transform means, for deleting the first N' samples from the impulse output signal of said 2N'-point inverse fast Fourier transform means and for outputting the last N' samples of the impulse output signal as an estimated echo signal;

a delay circuit, connected to the echo path, for delaying the echo signal passed through the echo path by the N' samples to produce a delayed output; and a subtractor, connected to said output processing means and said delay circuit, for obtaining the error signal corresponding to the difference between the delayed output of said delay circuit and the estimated echo signal.

2. An echo canceller as set forth in claim 1, wherein said coefficient updating means comprises:

zero padding means, connected to the output end, for padding N' "0"s before the N' samples of the error signal so as to form a frame consisting of 2N′ samples; and second 2N′-point fast Fourier transform means, connected to said zero padding means, for effecting a fast Fourier transform on the frame of said zero padding means so as to output 2N′ error coefficients.

3. An echo canceller as set forth in claim 2, wherein said coefficient updating means further comprises:

multiplication means for multiplying complex conjugates of the impulse signals corresponding to each respective block by the error coefficients to generate multiplied coefficients;

second 2N′-point inverse fast Fourier transform means, connected to the multiplied output of said another 2N′-point fast Fourier transform for effecting an inverse fast Fourier transform on the multiplied coefficients; and third 2N′-point fast Fourier transform means, connected to said second 2N′-point inverse fast Fourier transform means, for effecting a fast Fourier transform on 2N′ samples of data consisting the first N′ samples of the output of said second inverse fast Fourier transform means and N′ samples of "0"s so as to update the estimate coefficients applied in said finite impulse response filtering means.

4. An echo canceller as set forth in claim 1, wherein the integer N′ is selected to be a power of two.

5. A echo canceller as recited in claim 1, wherein said finite impulse response filtering means delays each of the 2N′ points of signals by N′×P samples where $0 \leq P \leq k-1$.

6. A system for cancelling an echo signal passed through an echo path with an impulse response, comprising:

overlap processing means for receiving an input signal series of 2N′ samples and for overlapping N′ of the 2N′ samples with N′ samples of the previous 2N′ samples to generate overlapped samples;

fast Fourier transform means for effecting a Fourier transform on the overlapped samples by said overlap processing means to produce 2N′ frequency domain points;

finite impulse response filtering means for dividing the impulse response, having a length N′ into k blocks, each consisting of N′ samples, and for delaying the 2N′ frequency domain points to produce 2N′ delayed frequency domain points, respectively multiplying the 2N′ delayed frequency domain points with estimate coefficients to produce multiplied outputs, and adding the multiplied outputs to output frequency response signals;

inverse fast Fourier transform means for effecting an inverse fast Fourier transform on the output frequency response signals of said finite impulse response filtering means to generate output impulse signals having 2N′ samples;

output processing means for obtaining an echo cancelling signal by selecting the last N′ samples from the 2N′ samples of the output impulse signals of said inverse fast Fourier transform means; and coefficient updating means for effecting an updating process of the estimate coefficients of said finite impulse response filtering means.

7. An echo canceller as set forth in claim 6, wherein the number N′ is selected to be a power of two.

8. A echo canceller as recited in claim 6, wherein said finite impulse response filtering means delays each of the 2N′ frequency domain points by N′×P samples where $0 \leq P \leq k-1$.

9. A system as recited in claim 6, wherein said system further comprises delay means for receiving the echo signal and delaying the echo signal to produce a delayed echo signal, and wherein said coefficient updating means updates the estimate coefficients based on a difference between the delayed echo signal and the echo cancelling signal.

10. A method for cancelling an echo signal having an impulse response of length N resulting from a input signal, where N is an integer, comprising the steps of:

(a) generating 2N′ samples of the input signal, with N′ samples of current 2N′ samples being overlapped with a N′ samples or previous 2N′ samples;

(b) effecting a fast Fourier transform on the 2N′ samples to generate 2N′ point signals;

(c) dividing the impulse response of length N into k blocks, each block having a length N′, where k and N′ are integers;

(d) delaying the 2N′ point signals x·N′ samples, where $0 \leq x \leq k-1$, to generate 2N′ delayed point signals;

(e) multiplying the 2N′ delayed point signals by estimate coefficients, respectively, to generate estimate block impulse signals;

(f) adding the estimate block impulse signals corresponding to each of the estimate coefficients for each of the k blocks to generate 2N′ estimate impulse signals;

(g) effecting an inverse fast Fourier transform on the estimate impulse signals to generate 2N′ estimate samples;

(h) generating an estimated echo signal from N′ samples of the 2N′ estimate samples; and (i) subtracting the estimated echo signal from the echo signal to cancel the echo signal.

11. A method as set forth in claim 10, wherein the integer N′ is a power of 2.

12. A method as set forth in claim 11, wherein said subtracting step (i) generates an error signal, and wherein said method further comprising the steps:

(k) delaying the echo signal N′ samples prior to said subtracting step (i); and (l) updating the estimate coefficients based upon the error signal.

* * * * *

UNITED STATES PATENT AND TRADEMARK OFFICE
CERTIFICATE OF CORRECTION

PATENT NO. : 4,951,269
DATED : August 21, 1990
INVENTOR(S) : Amano et al.

It is certified that error appears in the above-identified patent and that said Letters Patent is hereby corrected as shown below:

PTO - Col. 1, line 13, after "the" insert --number--;

line 24, before "overlapped" insert --an--.

Col. 2, line 12, (in equation (1)), " $\doteq$ " should be -- = --;

line 47, (in equation (2)),

"$(H_k^0, H_k^1, \ldots, H_k^{N+L-2}) = $"

should be

"$(H_k^0, H_k^1, \ldots, H_k^{N+L-2}) = $";

line 63, "$H_k^0, H_k^1$" should be

--$H_k^0, H_k^1$--.

line 64, "$H_k^{N+L-2}$" should be

--$H_k^{N+L-2}$--.

UNITED STATES PATENT AND TRADEMARK OFFICE
CERTIFICATE OF CORRECTION

PATENT NO. : 4,951,269
DATED : August 21, 1990
INVENTOR(S) : Amano et al.

It is certified that error appears in the above-identified patent and that said Letters Patent is hereby corrected as shown below:

Col. 3, line 10, "$H_k^i$" should be --$H_k^i$--.

Col. 4, line 17, "$H_k^0$, $H_k^1$" should be --$H_k^0$, $H_k^1$--;

line 18, "$H_k^{N+L-2}$" should be --$H_k^{N+L-2}$--;

line 36, "$D_k^0$, $k_k^1$, ..., $D_k^{(N+L-2)}$" should be --$E_k^0$, $E_k^1$, ... $E_k^{(N+L-2)}$--;

UNITED STATES PATENT AND TRADEMARK OFFICE
CERTIFICATE OF CORRECTION

PATENT NO. : 4,951,269
DATED : August 21, 1990
INVENTOR(S) : Amano et al.

It is certified that error appears in the above-identified patent and that said Letters Patent is hereby corrected as shown below:

line 39, "$E_k^0, E_k^1, \ldots, E_k^{(N+L-2)}$" should be $--E_k^0, E_k^1, \ldots, E_k^{(N+L-2)}--$, and "conjugatesof" should be --conjugates of--;

line 44, "preceiding" should be --preceding--;

line 49, "$H_k^0, H_k^1, \ldots, H_k^{(N+L-2)}$" should be $--H_k^0, H_k^1, \ldots, H_k^{(N+L-2)}--$;

line 50, delete "are";

line 55, "ach" should be --each--;

UNITED STATES PATENT AND TRADEMARK OFFICE
CERTIFICATE OF CORRECTION

PATENT NO. : 4,951,269
DATED : August 21, 1990
INVENTOR(S) : Amano et al.

It is certified that error appears in the above-identified patent and that said Letters Patent is hereby corrected as shown below:

line 57, delete "adaption"; and insert "adaptation"

line 61, "(k+1)" should be --(k+1)L--;

line 66, "$D = e_{kL}^2 + e_{kL+1}^2 + \cdots e_{kL+(L-1)}^2$" should be --$D = e_{kL}^2 + e_{kL+1}^2 + \cdots + e_{kL+(L-1)}^2$--.

Col. 5, line 8, "$h_{kL}i$" should be --$h_{kL}^i$--;

line 55, "$H_k^T$ and $X_k^T$" should be --$H_k^T$ and $X_k^T$--;

line 62, "$H_k^0 - H_k^{(N+L-2)}$" should be --$H_k^0 - H_k^{(N+L-2)}$--.

UNITED STATES PATENT AND TRADEMARK OFFICE
CERTIFICATE OF CORRECTION

PATENT NO. :  4,951,269
DATED :  August 21, 1990
INVENTOR(S) :  Amano et al.

It is certified that error appears in the above-identified patent and that said Letters Patent is hereby corrected as shown below:

Col. 6,  line 17, after "FFT" insert --149--;

line 20, "vol" should be --vol.--.

PTO - Col. 9,  line 37, change "$H_0{}^i$ and $H_1{}^i$" to

--$H_0^i$ and $H_1^i$--;

line 58, change "$H_0{}^0$" to --$H_0^0$--, and change "$H_0 2N'-1$" to --$H_0^{2N'-1}$--;

UNITED STATES PATENT AND TRADEMARK OFFICE
CERTIFICATE OF CORRECTION

Page 6 of 9

PATENT NO. : 4,951,269
DATED : August 21, 1990
INVENTOR(S) : Amano et al.

It is certified that error appears in the above-identified patent and that said Letters Patent is hereby corrected as shown below:

line 63, "$H_1^0$" should be --$H_1^0$--, and

"$H_1^{2N'-1}$" should be

--$H_1^{2N'-1}$--.

[Note, line numbers printed are utilized even though incorrect]

Col. 11, line 7, "$H_0^0$" should be --$H_0^0$--;

line 8, "$H_{2N'-1}^0$" should be --$H_{2N-1}^0$--;

line 14, "$H_0^1$" should be --$H_0^1$--, and

"$H_{2N'-1}^1$" should be --$H_{2N'-1}^1$--;

UNITED STATES PATENT AND TRADEMARK OFFICE
CERTIFICATE OF CORRECTION

PATENT NO. : 4,951,269

DATED : August 21, 1990

INVENTOR(S) : Amano et al.

It is certified that error appears in the above-identified patent and that said Letters Patent is hereby corrected as shown below:

line 16, "$H_0^i$" should be --$H_0^i$--, and "$H_{2N'-1}^i$" should be --$H_{2N'-1}^i$--;

line 22, "$H_0^0$" should be --$H_0^0$--;

line 23, change "$H_0^{k-1}$, $H_1^0$" to --$H_0^{k-1}$, $H_1^0$--, change "$H_1^{k-1}$" to --$H_1^{k-1}$--, and change "$H_{2N'-1}^0$" to --$H_{2N'-1}^0$--;

line 24, change "$H_{2N'-1}$" to --$H_{2N'-1}^{k-1}$--;

UNITED STATES PATENT AND TRADEMARK OFFICE
CERTIFICATE OF CORRECTION

PATENT NO. : 4,951,269
DATED : August 21, 1990
INVENTOR(S) : Amano et al.

It is certified that error appears in the above-identified patent and that said Letters Patent is hereby corrected as shown below:

line 25, change "12-(2N"1)" to --12-(2N'-1)--;

line 54, change "$H_k^{i}$" to --$H_k^i$--.

Col. 12, line 63, change "$H_{k,N}{}^i$" to --$H_{k,N'}^i$--, and change "$H_{k+1,N'}{}^i$" to --$H_{k+1,N'}^i$--.

Col. 13, line 51, change "$H_i{}^k$" to --$H_i^k$--.

UNITED STATES PATENT AND TRADEMARK OFFICE
CERTIFICATE OF CORRECTION

PATENT NO. : 4,951,269
DATED : August 21, 1990
INVENTOR(S) : Amano et al.

It is certified that error appears in the above-identified patent and that said Letters Patent is hereby corrected as shown below:

Col. 14, line 20, change "N," to --N'--;

line 23, change "N," to --N'--;

Col. 15, line 37, change "and for" to --by--;

line 39, change "form" to

--form means--.

line 46, change "N'" to --N,--;

line 47, change "and for" to --by--.

Signed and Sealed this

Twenty-eighth Day of April, 1992

Attest:

HARRY F. MANBECK, JR.

*Attesting Officer*     *Commissioner of Patents and Trademarks*